(12) United States Patent
Yasuda et al.

(10) Patent No.: US 8,054,647 B2
(45) Date of Patent: Nov. 8, 2011

(54) ELECTRONIC DEVICE MOUNTING STRUCTURE FOR BUSBAR

(75) Inventors: Akio Yasuda, Kosai (JP); Mutsumi Yoshino, Nagoya (JP)

(73) Assignee: Denso Corporation, Kariya (JP)

( * ) Notice: Subject to any disclaimer, the term of this patent is extended or adjusted under 35 U.S.C. 154(b) by 640 days.

(21) Appl. No.: 12/203,408

(22) Filed: Sep. 3, 2008

(65) Prior Publication Data
US 2009/0059548 A1    Mar. 5, 2009

(30) Foreign Application Priority Data
Sep. 3, 2007    (JP) ................. 2007-228083

(51) Int. Cl.
*H05K 1/11*    (2006.01)
*H05K 1/14*    (2006.01)
(52) U.S. Cl. ........................ 361/803; 361/813
(58) Field of Classification Search .................. 361/720, 361/760, 748, 803, 728, 772–775, 813, 679.01, 361/752; 174/50, 59, 68.1, 68.2, 520, 521; 439/76.1, 76.2, 246, 249, 251, 485, 733.1, 439/736, 801
See application file for complete search history.

(56) References Cited

U.S. PATENT DOCUMENTS

| | | | | |
|---|---|---|---|---|
| 4,627,151 A | * | 12/1986 | Mulholland et al. | 438/111 |
| 6,372,998 B1 | * | 4/2002 | Suzuki et al. | 174/260 |
| 7,137,852 B2 | * | 11/2006 | Tsukamoto | 439/698 |
| 7,154,753 B2 | * | 12/2006 | Kobayashi | 361/715 |
| 7,582,552 B2 | * | 9/2009 | Yamasaki et al. | 438/612 |
| 2005/0287843 A1 | | 12/2005 | Tsukamoto | |

FOREIGN PATENT DOCUMENTS

| | | |
|---|---|---|
| JP | 1-113385 | 7/1989 |
| JP | 2-13772 | 1/1990 |
| JP | 3-12463 | 2/1991 |
| JP | 05-067870 | 3/1993 |
| JP | 8-274421 | 10/1996 |
| JP | 2002-93995 | 3/2002 |
| JP | 2005-302853 | 10/2005 |

OTHER PUBLICATIONS

Japanese Office Action dated Aug. 27, 2009, issued in corresponding Japanese Application No. 2007-228083, with English translation.

* cited by examiner

*Primary Examiner* — Hung S Bui
(74) *Attorney, Agent, or Firm* — Nixon & Vanderhye PC

(57) ABSTRACT

An electronic device mounting structure includes an electronic device, a busbar, and a solder. The electronic device has a body and a lead protruding from the body. The busbar has a flat portion and a wall portion rising from a periphery of the flat portion. The flat portion of the busbar extends parallel to a tip portion of the lead and is in contact with a back surface of the tip portion. The wall portion of the busbar faces a side surface of the tip portion with a predetermined space. The solder is located in the space and joins the side surface of the tip portion and the wall portion of the busbar.

17 Claims, 5 Drawing Sheets

LEFT ← → RIGHT

ELECTRONIC DEVICE MOUNTING STRUCTURE FOR BUSBAR

CROSS REFERENCE TO RELATED APPLICATION

This application is based on and incorporates herein by reference Japanese Patent Application No. 2007-228083 filed on Sep. 3, 2007.

FIELD OF THE INVENTION

The present invention relates to a structure for mounting an electronic device to a busbar and, in particular, relates to a structure in which a lead of an electronic device is joined to a busbar through a solder.

BACKGROUND OF THE INVENTION

A common package structure for an electronic device such as an integrated circuit (IC) includes a dual inline package (DIP), a single inline package (SIP), and a zigzag inline package (ZIP). This type of package structure is generally constructed with a housing and a row of leads protruding from a side of the housing. An electronic device employing such a package structure is hereinafter called the "lead-equipped electronic device".

It is well known that the lead-equipped electronic device is mounted on a printed circuit board by soldering the leads to trace patterns of the circuit board. JP-A-2002-93995 discloses a structure in which the lead-equipped electronic device is mounted on a busbar by soldering the leads to the busbar. The long-term durability of the structure disclosed in JP-A-2002-93995 may be reduced due to thermal stress exerted on the solder joints between the leads and the busbar.

SUMMARY OF THE INVENTION

In view of the above-described problem, it is an object of the present invention to provide a structure for mounting an electronic device to a busbar and for achieving high resistance to repeated thermal stress.

An electronic device mounting structure includes an electronic device, a busbar, and a solder. The electronic device has a body and a lead protruding from the body. The busbar has a flat portion and a wall portion rising from a periphery of the flat portion. The flat portion of the busbar extends parallel to a tip portion of the lead and is in contact with a back surface of the tip portion. The wall portion of the busbar faces a side surface of the tip portion with a predetermined space. The solder is located in the space and joins the side surface of the tip portion and the wall portion of the busbar.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

First Embodiment

Figure 1:
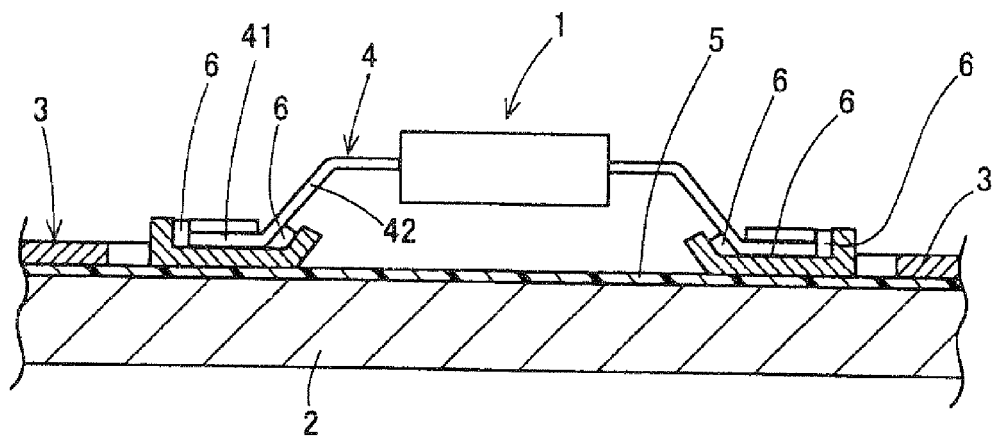
FIG. 1 is a diagram illustrating a cross-sectional view of an electronic device mounting structure according to a first embodiment of the present invention.

An electronic device mounting structure according to a first embodiment of the present invention is described below with reference to FIGS. 1, 2. The mounting structure includes an electronic device 1, a board 2, and a plurality of busbars 3. The electronic device 1 is a resin-molded integrated circuit (IC) constructed as a dual in-line package (DIP). The electronic device 1 has a body and two parallel rows of leads 4 protruding from either side of the body. For example, the board 2 can be made from an aluminum alloy plate having a certain thickness. The busbars 3 and the leads 4 can be made of copper. The busbars 3 and the leads 4 are generally the same in number. Each lead 4 protrudes horizontally from the body, then extends obliquely downward, and finally extends horizontally. In this way, the lead 4 has a root portion protruding horizontally from the body, an oblique portion 42 extending obliquely downward from the root portion, and a tip portion 41 extending horizontally from the oblique portion 42. The tip portion 41 of the lead 4 is joined to a corresponding busbar 3.

An electrically insulation film 5 such as a resin film is placed on a surface of the board 2. The tip portion 41 of the lead 4 is joined to a tip portion of the busbar 3 through a solder 6.

The busbar 3 can be constructed from copper sheet metal by punching press, stamping, or the like. The busbar 3 is fixed to the board 2 through the insulation film 5. Each of the busbar 3 and the insulation film 5 has a through hole (not shown), and the board 2 has a screw hole (not shown) communicating with the through hole. The busbar 3 is fixed to the board 2 by a screw (not shown) inserted into the screw hole of the board 2 through the through holes of the busbar 3 and the insulation film 5. The screw is housed in a resin sleeve so that the busbar 3 can be electrically insulated from the board 2 and the screw.

Figure 2:
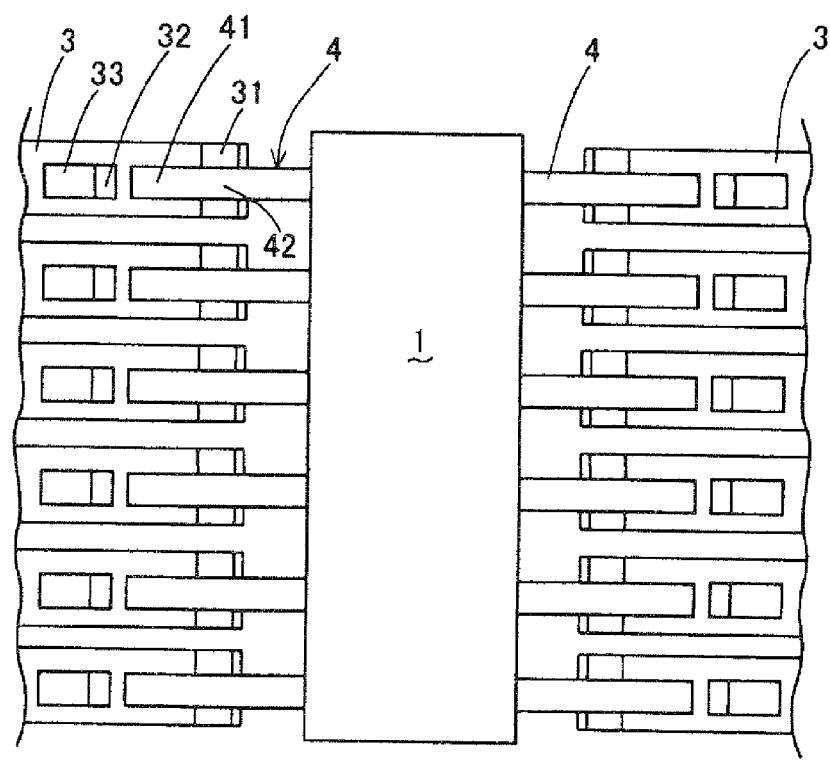
FIG. 2 is a diagram illustrating a top view of FIG. 1.

In the first embodiment, as shown in FIG. 2, the electronic device 1 has two parallel rows of six leads 4 (i.e., twelve leads 4 in total). The number of the leads 4 can vary. The electronic device 1 can be a device other than the resin-molded IC. For example, the electronic device 1 can be a ceramic package IC or the like The board 2 can be made of a material other than aluminum alloy. For example, the board 2 can be made of resin or the like. The busbar 3 and the lead 4 can be made of a material other than copper.

Figure 3:
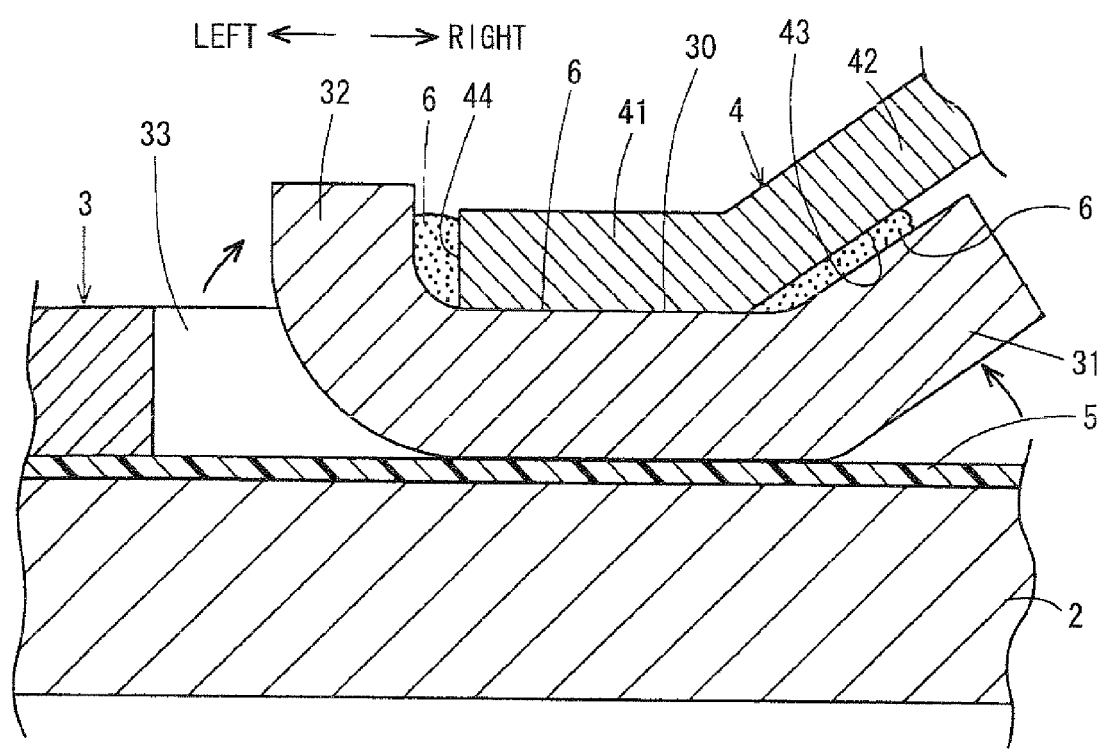
FIG. 3 is a diagram illustrating a partially enlarged view of FIG. 1.

The electronic device mounting structure according to the first embodiment is characterized by a solder joint structure illustrated in FIG. 3.

The tip portion of the busbar 3 has a flat portion 30. The flat portion 30 extends parallel to the tip portion 41 of the lead 4 and is in contact with a back surface of the tip portion 41. The flat portion 30 is joined to the back surface of the tip portion 41 through the solder 6.

The tip portion of the busbar 3 further has front and rear walls 31, 32 rising from the periphery of the flat portion 30. The front and rear walls 31, 32 face each other across the tip portion 41 of the busbar 3 in a longitudinal direction (i.e., left-right direction of FIG. 3) of the busbar 3.

The front wall 31 of the busbar 3 faces a first side surface 43 of the tip portion 41 of the lead 4 with a predetermined space. The first side surface 43 of the tip portion 41 is located on a root-side of the lead 4. More specifically the front wall 31 faces a back surface of the oblique portion 42 of the lead 4 with the predetermined space. The front wall 31 can be formed by bending the tip portion of the busbar 3 along the oblique portion 42.

The rear wall 32 of the busbar 3 faces a second side surface 44 of the tip portion 41 of the lead 4 with a predetermined space. The second side surface 44 of the tip portion 41 is located on a tip-side of the lead 4. More specifically, the rear wall 32 faces a tip end surface of the lead 4 with the predetermined space. The rear wall 32 can be formed by partially cutting the busbar 3 and by bending upward the cut portion such that an opening 33 can appear.

The solder 6 is located in the space between the front wall 31 of the busbar 3 and the first side surface 43 of the lead 4. Thus, the front wall 31 of the busbar 3 is joined to the first side surface 43 of the lead 4 through the solder 6. Further, the solder 6 is located in the space between the rear wall 32 of the busbar 3 and the second side surface 44 of the lead 4. Thus, the rear wall 32 of the busbar 3 is joined to the second side surface 44 through the solder 6. In this way, the solder 6 is applied to three surfaces (i.e., back surface and side surfaces 43, 44) of the tip portion 41 of the lead 4 so that the busbar 3 and the lead 4 can be joined together at the three surfaces. That is, the busbar 3 and the lead 4 are joined together in a three dimensional manner.

The solder joint structure shown in FIG. 3 can provide the following advantages. As shown in FIGS. 1, 2, the lead 4 of the electronic device 1 is elongated to be away from the body. The busbar 3 has a fixed portion to be fixed to the board 2 by the screw and a soldered portion to be joined to the lead 4 by the solder 6. Typically, the fixed and soldered portions are distanced from each other in the longitudinal direction of the busbar 3 so that the electronic device 1 can be easily mounted to the busbar 3.

In the electronic device mounting structure, since the fixed and soldered portions are distanced from each other in the longitudinal direction, the busbar 3 is likely to expand and contract in the longitudinal direction due to a temperature change. Typically, the board 2 and the busbar 3 are made of different materials. Therefore, the solder 6 joining the busbar 3 and the lead 4 is subjected to thermal stress in the longitudinal direction, due to a difference in coefficients of thermal expansion (linear expansion) between the board 2 and the busbar 3. Specifically, the difference in coefficients of thermal expansion between the board 2 and the busbar 3 causes the busbar 3 to be displaced with respect to the board 2 in the longitudinal direction of the busbar 3. For example, when the busbar 3 is caused to be displaced in the right direction of FIG. 3, the solder 6 joining the front wall 31 and the first side surface 43 is subjected to tensile force, and the solder 6 joining the rear wall 32 and the second side surface 44 is subjected to compressive force.

In this way, the stress resulting from the difference in coefficients of thermal expansion can be suitably distributed between the solder 6 joining the front wall 31 and the first side surface 43 and the solder 6 joining the rear wall 32 and the second side surface 44. Accordingly, shear stress exerted on the solder 6 applied between the back surface of the tip portion 41 of the lead 4 and the flat portion 30 of the busbar 3 can be greatly reduced. Therefore, the busbar 3 and the lead 4 can remain joined together over the long term. Further, since the solder 6 is applied to the side surfaces 43, 44 in addition to the back surface of the lead 4, areas of solder joints between the busbar 3 and the lead 4 are increased. Therefore, electrical resistances at the solder joints can be reduced.

Thus, the electronic device mounting structure according to the first embodiment can achieve high resistance to repeated thermal stress and have an improved long-term durability.

For example, the electronic device mounting structure according to the first embodiment can be manufactured as follows. Firstly, the busbars 3 are formed from cupper sheet metal in a punching press process. The front and rear walls 31, 32 are formed in this punching press process at the same time. Alternatively, the front and rear walls 31, 32 can be formed in another process. Then, each busbar 3 is placed on the board 2 through the insulation film 5. Then, the busbar 3 is fixed to the board 2 by the screw (not shown). Finally, the tip portion 41 of each lead 4 is joined to the tip portion of the corresponding busbar 3 by the solder 6.

As described above, according to the first embodiment, the busbar 3 has the front and rear walls 31, 32 facing each other across the flat portion 30 in the longitudinal direction of the busbar 3. The front wall 31 of the busbar 3 faces the first side surface 43 of the tip portion 41 of the lead 4 with the predetermined space. The rear wall 32 of the busbar 3 faces a second side surface 44 of the tip portion 41 of the lead 4 with a predetermined space. The tip portion 41 of the lead 4 is joined to the flat portion 30 of the busbar 3 through the solder 6. Further, the tip portion 41 of the lead 4 is joined to the front and rear walls 31, 32 through the solder 6. In such an approach, the shear stress exerted on the solder 6 applied between the back surface of the tip portion 41 of the lead 4 and the flat portion 30 of the busbar 3 can be greatly reduced so that the busbar 3 and the lead 4 can remain joined together over the long term.

Second Embodiment

An electronic device mounting structure according to a second embodiment of the present invention is described below with reference to FIGS. 4-6. A difference between the first and second embodiments is as follows.

In addition to the front and rear walls 31, 32, the tip portion of the busbar 3 further has a pair of side walls 35, 36 rising from the periphery of the flat portion 30. As shown in FIG. 5, the side walls 35, 36 face each other across the tip portion 41 of the lead 4 in a lateral direction, perpendicular to the longitudinal direction (i.e. left-right direction of FIG. 4), of the busbar 3. As shown in FIG. 6, the side walls 35, 36 can be formed by bending upward either side of the busbar 3 in the lateral direction. That is, a structure of FIG. 5 can be obtained by bending a structure of FIG. 6 in a direction indicated by arrows.

The side walls 35, 36 of the busbar 3 face third and fourth side surfaces 45, 46 of the tip portion 41 with predetermined spaces, respectively. The third and fourth side surfaces 45, 46 of the lead 4 are located in a lateral direction perpendicular to a longitudinal direction (i.e., left-right direction of FIG. 4) of the lead 4.

Figure 5:
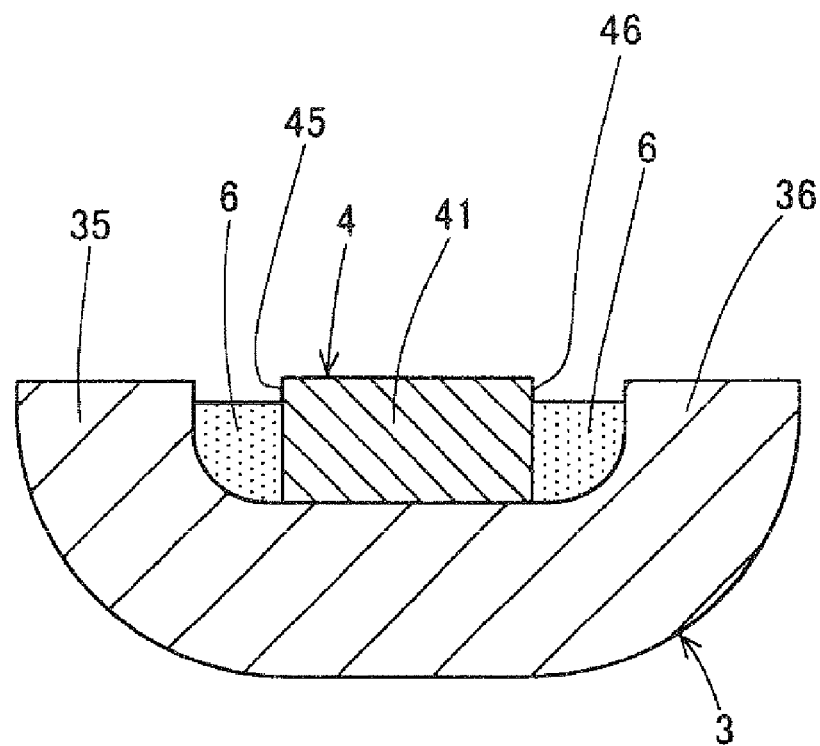
FIG. 5 is a diagram illustrating a cross-sectional view taken along line V-V of FIG. 4 and illustrating a condition after side walls are bent.
Figure 6:
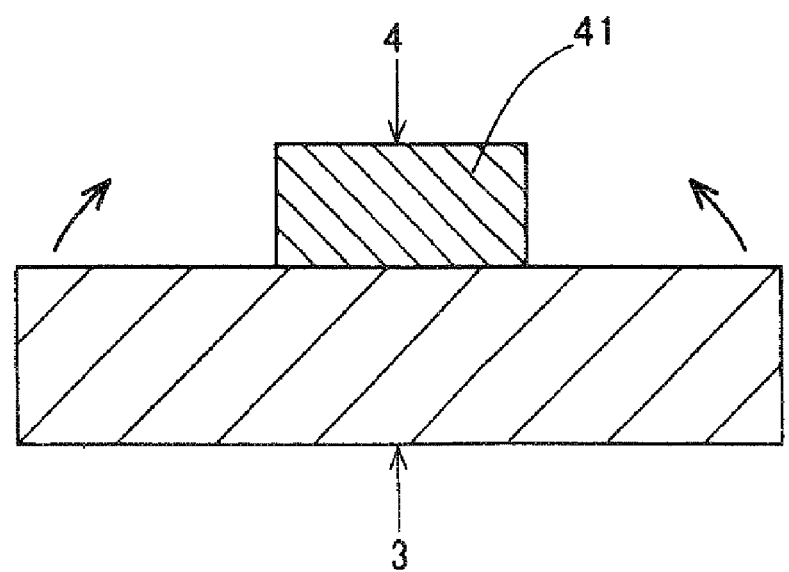
FIG. 6 is a diagram corresponding to FIG. 5 and illustrating a condition before the side walls are bent.

As shown in FIG. 5, the solder 6 is located in the space between the side wall 35 of the busbar 3 and the third side surface 45 of the lead 4. Thus, the side wall 35 of the busbar 3 is joined to the third side surface 45 through the solder 6. Likewise, the solder 6 is located in the space between the side wall 36 of the busbar 3 and the fourth side surface 46 of the lead 4. Thus, the side wall 36 of the busbar 3 is joined to the fourth side surface 46 of the lead 4 through the solder 6.

Like the front and rear walls 31, 32, the side walls 35, 36 can be formed in the punching press process, in which the busbars 3 are formed from cupper sheet metal. Alternatively, the front and rear walls 31, 32 can be formed in another process.

As described above, according to the second embodiment, the busbar 3 has the side walls 35, 36 in addition to the front and rear walls 31, 32. Thus, the tip portion 41 of the lead 4 is surrounded by the walls 31, 32, 35, 36. The side walls 35, 36 of the busbar 3 is joined through the solder 6 to the third and fourth side surfaces 45, 46 of the lead 4. Therefore, when the busbar 3 is caused to be displaced in the longitudinal direction, shear stress occurs in the solders 6 joining the side walls 35, 36 and the side surfaces 45, 46, respectively. The shear stress helps prevent the busbar 3 from being displaced in the longitudinal direction. Therefore, the busbar 3 and the lead 4 can remain joined together over the long term. Thus, the electronic device mounting structure according to the second embodiment can achieve high resistance to repeated thermal stress and have an improved long-term durability.

Figure 4:
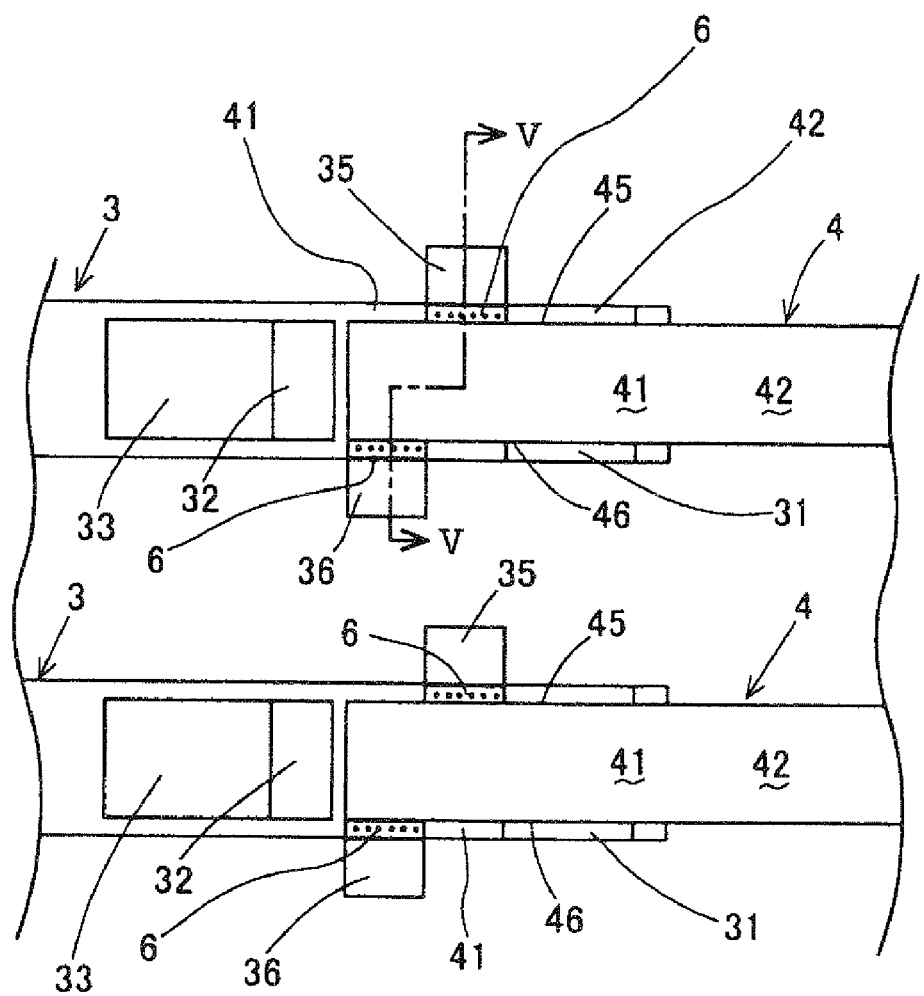
FIG. 4 is a diagram illustrating a top view of an electronic device mounting structure according to a second embodiment of the present invention.

It is preferable that the side walls 35, 36 of the busbar 3 indirectly face each other in the lateral direction of the busbar 3, as shown in FIG. 4. In other words, it is preferable that the side walls 35, 36 of the busbar 3 be positioned at different locations in the longitudinal direction of the busbar 3. In such an approach, multiple busbars 3 can be formed from the sheet metal in such a manner that a region for the side wall 35 of one busbar 3 is located adjacent to a region for the side wall 36 of the other busbar 3 in the longitudinal direction of the busbar 3. Thus, the sheet metal can be used efficiently with little waste.

Third Embodiment

An electronic device mounting structure according to a third embodiment of the present invention is described below with reference to FIG. 7. A difference between the first and third embodiments is as follows. In the third embodiment, the tip portion of the busbar 3 has a rectangular recess 37 for receiving the tip portion 41 of the lead 4. The recess 37 can be formed by pressing the tip portion of the busbar 3.

Figure 7:
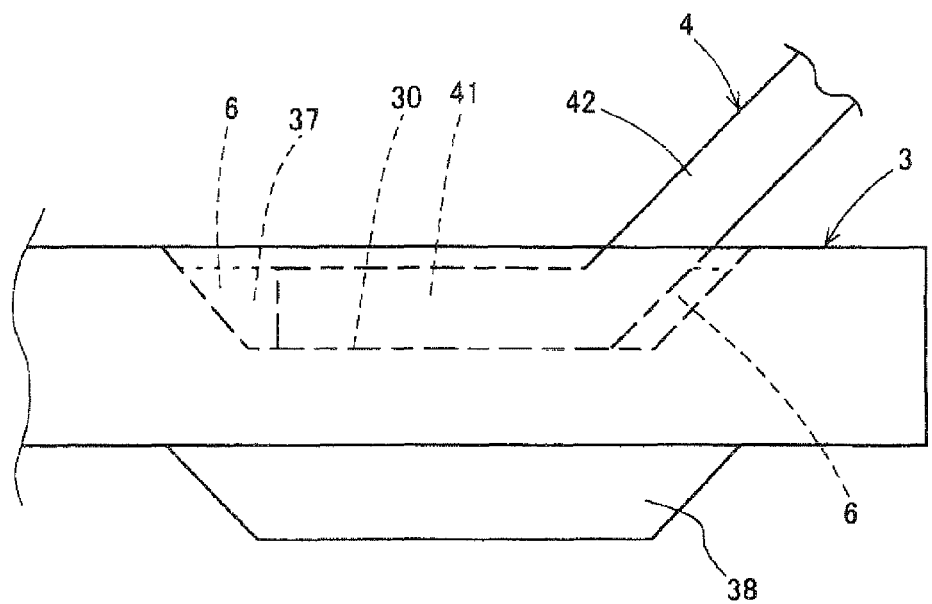
FIG. 7 is a diagram illustrating a side view of an electronic device mounting structure according to a third embodiment of the present invention.

Typically, when the recess 37 is formed by pressing, the busbar 3 is deformed vertically so that a projection 38 is formed in the back of the recess 37, as shown in FIG. 7. As a result, a back of the busbar 3 is not flat. The recess 37 can be formed in such a manner that the back of the busbar 3 can remain flat. For example, the pressing process is performed in a condition, where the back of the busbar 3 is placed on a hard base, and space greater than the volume of the recess 37 is provided on sides of the busbar 3. In such an approach, the busbar 3 is deformed horizontally not vertically so that the projection 38 is formed on the sides of the busbar 3. Thus, the back of the busbar 3 can remain flat, even after the recess 37 is formed by pressing.

The recess 37 is sized and shaped so that the tip portion 41 and a part of the oblique portion 42 near the tip portion 41 can be accommodated in the recess 37. A bottom of the recess 37 serves as the flat portion 30. The tip portion 41 of the lead 4 is placed in the recess 37, and the back surface of the tip portion 41 is in close contact with the flat portion 30. Then, a melted solder 6 is disposed in the recess 37 so that the tip portion 41 can be joined to an inner surface of the recess 37 through the solder 6.

As described above, according to the third embodiment of the present invention, the tip portion of the busbar 3 has the recess 37 for receiving the tip portion 41 of the lead 4. The lead 4 is joined through the solder 6 to the busbar 3 in the recess 37. In such an approach, the busbar 3 and the lead 4 can be reliably joined together through the solder 6. Further, since the solder 6 remains in the recess 37, a cold solder joint is prevented so that yield can be greatly improved.

Fourth Embodiment

Figure 8:
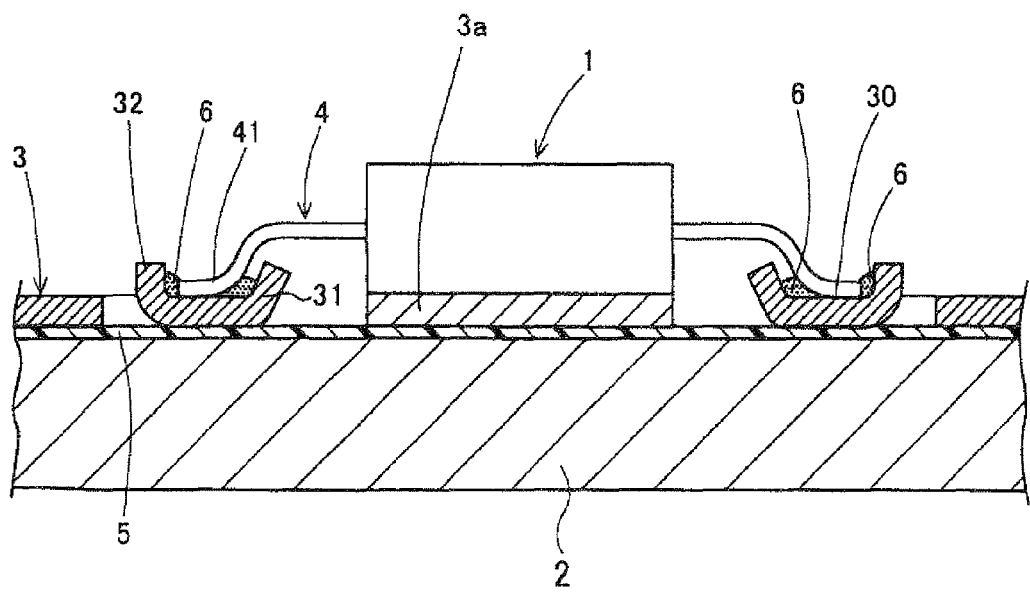
FIG. 8 is a diagram illustrating a cross-sectional view of an electronic device mounting structure according to a fourth embodiment of the present invention.

An electronic device mounting structure according to a fourth embodiment of the present invention is described below with reference to FIG. 8. A difference between the first and fourth embodiments is as follows. In the fourth embodiment, a support base 3a is placed between the body of the electronic device 1 and the board 2 through the insulation film 5. The support base 3a can be integrally formed with the busbar 3. That is, the busbar 3 and the support base 3a can be a single piece. Alternatively, the busbar 3 and the support base 3a can be separate pieces.

As described above, according to the fourth embodiment, the body of the electronic device 1 is supported on the board 2 through the support base 3a and the insulation film 5. The support base 3a helps prevent the body of the electronic device 1 from vibrating so that the lead 4 of the electronic device 1 can remain joined to the busbar 3. Therefore, the electronic device mounting structure according to the fourth embodiment can achieve high resistance to vibration.

(Modifications)

The embodiments described above can be modified in various ways. For example, the insulation film 5 can be bonded to at least one of the board 2, the busbar 3, and the support base 3a. In the embodiments, the walls 31, 32, 35, 36 are formed by bending the busbar 3. That is, the walls 31, 32, 35, 36 are integrally formed with the busbar 3. Alternatively, the walls 31, 32, 35, 36 can be formed separately from the busbar 3.

The embodiments can be combined together. For example, the busbar 3 can have at least one of the walls 31, 32, 35, and 36. The busbar 3 can have the recess 37 in addition to at least one of the walls 31, 32, 35, and 36. In such a case, while one lead 4 can be joined through the solder 6 to the at least one of the walls 31, 32, 35, and 36, another lead 4 can be joined through the solder 6 to the inner surface of the recess 37.

Such changes and modifications are to be understood as being within the scope of the present invention as defined by the appended claims.

What is claimed is:

1. An electronic device mounting structure comprising: an electronic device having a body and a lead protruding from the body, the lead having a root portion joined to the body and a tip portion opposite to the root portion in a longitudinal direction thereof;

a busbar having a flat portion and a wall portion rising from a periphery of the flat portion, the flat portion extending parallel to the tip portion of the lead and being in contact with a back surface of the tip portion, the wall portion facing at least one side surface of the tip portion with a predetermined space, and a solder located in the space and joining the at least one side surface of the tip portion and the wall portion of the busbar, wherein the wall portion of the busbar includes a front wall facing a first side surface of the tip portion of the lead, and wherein the first side surface of the tip portion is located on a root-side of the lead in the longitudinal direction.

2. The electronic device mounting structure according to claim 1,
wherein the wall portion of the busbar includes a rear wall facing a second side surface of the tip portion of the lead, and
wherein the second side surface of the tip portion is located on a tip-side of the lead in the longitudinal direction.

3. The electronic device mounting structure according to claim 1,
wherein the wall portion of the busbar includes a pair of side walls facing third and fourth side surfaces of the tip portion of the lead,
wherein the third and fourth side surfaces of the tip portion are opposite each other in a lateral direction, perpendicular to the longitudinal direction, of the lead.

4. The electronic device mounting structure according to claim 3,
wherein the lead of the electronic device comprising a plurality of leads that are placed in a row at a predetermined interval,
wherein the busbar comprises a plurality of busbars, each busbar being joined to a corresponding lead by the solder,
wherein the plurality of busbars is formed from a metal sheet by pressing, and
wherein the pair of side walls of each busbar is formed by bending a portion of the busbar, the portion projecting in the lateral direction.

5. The electronic device mounting structure according to claim 4,
wherein the pairs of side walls of two adjacent busbars of the plurality of busbars are located at different positions in a longitudinal direction of the plurality of busbars.

6. The electronic device mounting structure according to claim 1,
wherein the wall portion of the busbar is configured to surround a perimeter of the tip portion of the lead.

7. The electronic device mounting structure according to claim 1,
wherein the wall portion is formed by bending the busbar.

8. The electronic device mounting structure according to claim 1,
wherein the wall portion is formed by pressing the busbar such that the flat portion is recessed with respect to the periphery.

9. The electronic device mounting structure according to claim 1,
wherein the lead of the electronic device comprising a plurality of leads that are arranged in a row at a predetermined interval, and
wherein the plurality of leads protrudes from either side of the body to form a dual in-line package.

10. An electronic device mounting structure comprising:
an electronic device having a body and a lead protruding from the body, the lead having a root portion joined to the body and a tip portion opposite to the root portion in a longitudinal direction thereof;
a busbar having a flat portion and a wall portion rising from a periphery of the flat portion, the flat portion extending parallel to the tip portion of the lead and being in contact with a back surface of the tip portion, the wall portion facing at least one side surface of the tip portion with a predetermined space, and a solder located in the space and joining the at least one side surface of the tip portion and the wall portion of the busbar,
wherein the wall portion of the busbar includes a rear wall facing a second side surface of the tip portion of the lead, and
wherein the second side surface of the tip portion is located on a tip-side of the lead in the longitudinal direction.

11. The electronic device mounting structure according to claim 10,
wherein the wall portion of the busbar includes a pair of side walls facing third and fourth side surfaces of the tip portion of the lead,
wherein the third and fourth side surfaces of the tip portion are opposite each other in a lateral direction, perpendicular to the longitudinal direction, of the lead.

12. The electronic device mounting structure according to claim 11,
wherein the lead of the electronic device comprising a plurality of leads that are placed in a row at a predetermined interval,
wherein the busbar comprises a plurality of busbars, each busbar being joined to a corresponding lead by the solder,
wherein the plurality of busbars is formed from a metal sheet by pressing, and
wherein the pair of side walls of each busbar is formed by bending a portion of the busbar, the portion projecting in the lateral direction.

13. The electronic device mounting structure according to claim 10,
wherein the pairs of side walls of two adjacent busbars of the plurality of busbars are located at different positions in a longitudinal direction of the plurality of busbars.

14. The electronic device mounting structure according to claim 10,
wherein the wall portion of the busbar is configured to surround a perimeter of the tip portion of the lead.

15. The electronic device mounting structure according to claim 10,
wherein the wall portion is formed by bending the busbar.

16. The electronic device mounting structure according to claim 10,
wherein the wall portion is formed by pressing the busbar such that the flat portion is recessed with respect to the periphery.

17. The electronic device mounting structure according to claim 10,
wherein the lead of the electronic device comprising a plurality of leads that are arranged in a row at a predetermined interval, and
wherein the plurality of leads protrudes from either side of the body to form a dual in-line package.

* * * * *